United States Patent [19]

Yokota

[11] Patent Number: 4,611,864

[45] Date of Patent: Sep. 16, 1986

[54] RECEPTACLE FOR MEMORY CASSETTE

[75] Inventor: Takashi Yokota, Tokyo, Japan

[73] Assignee: Ricoh Company, Ltd., Tokyo, Japan

[21] Appl. No.: 477,462

[22] Filed: Mar. 21, 1983

[30] Foreign Application Priority Data

Apr. 15, 1982 [JP] Japan .................................. 57-62977

[51] Int. Cl.$^4$ ............................................ A47B 81/06
[52] U.S. Cl. ..................................... 312/12; 206/387;
312/272.5; 312/276
[58] Field of Search .................... 206/387; 312/10, 12,
312/13, 15, 272, 272.5, 275, 276; 200/50 R, 50 A

[56] References Cited

U.S. PATENT DOCUMENTS 1,262,789  4/1918  Heller .............................. 312/275 X
2,244,145  6/1941  Erickson ......................... 312/276 X
3,966,408  6/1976  Drennen et al. ................ 312/276 X

FOREIGN PATENT DOCUMENTS 2478361  3/1980  France ................................ 206/387
5442072  10/1980  Japan ................................. 208/387

Primary Examiner—William E. Lyddane
Assistant Examiner—Joseph Falk
Attorney, Agent, or Firm—David G. Alexander

[57] ABSTRACT

A receptacle for detachably receiving a memory cassette is disclosed. A holder member reciprocates in unison with the movement of an openable cover member to hold the memory cassette thereon. Drive means is provided for driving the holder member in a reciprocal movement. The holder member includes means for locating the memory cassette.

12 Claims, 13 Drawing Figures

Fig. 2
Fig. 3
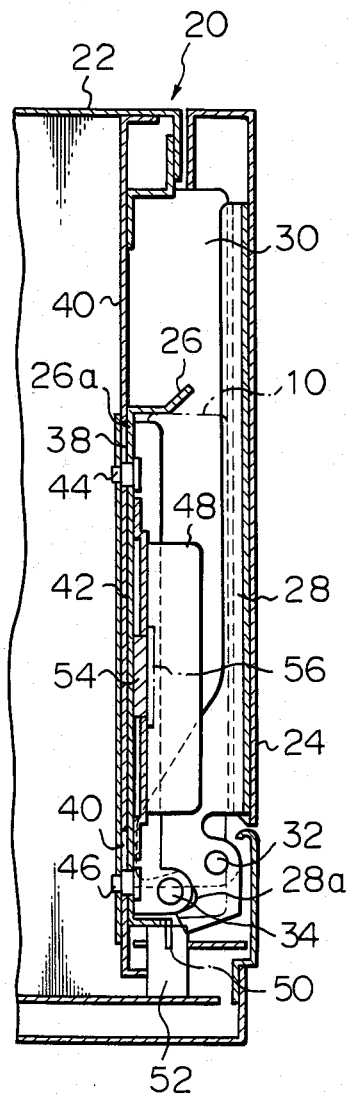
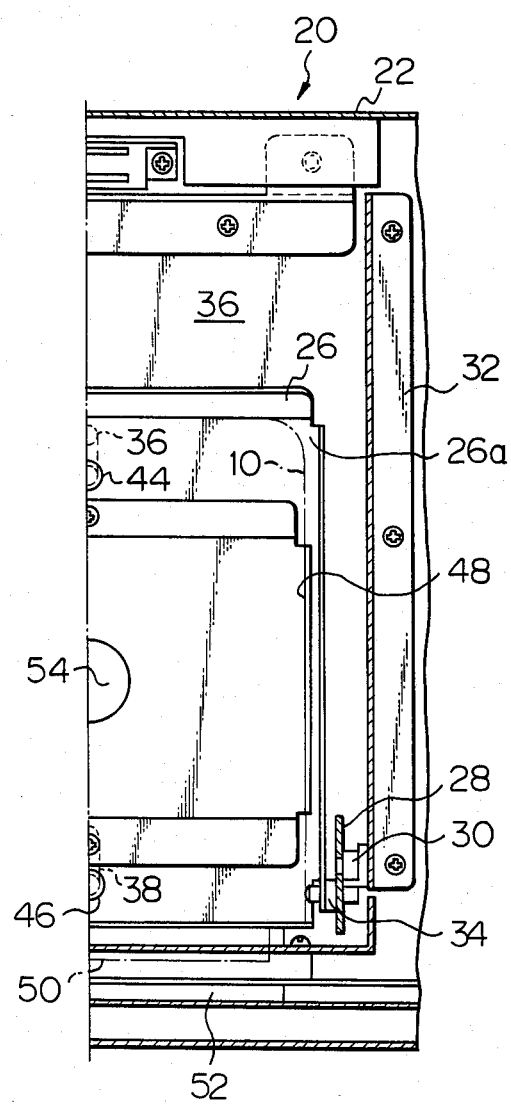

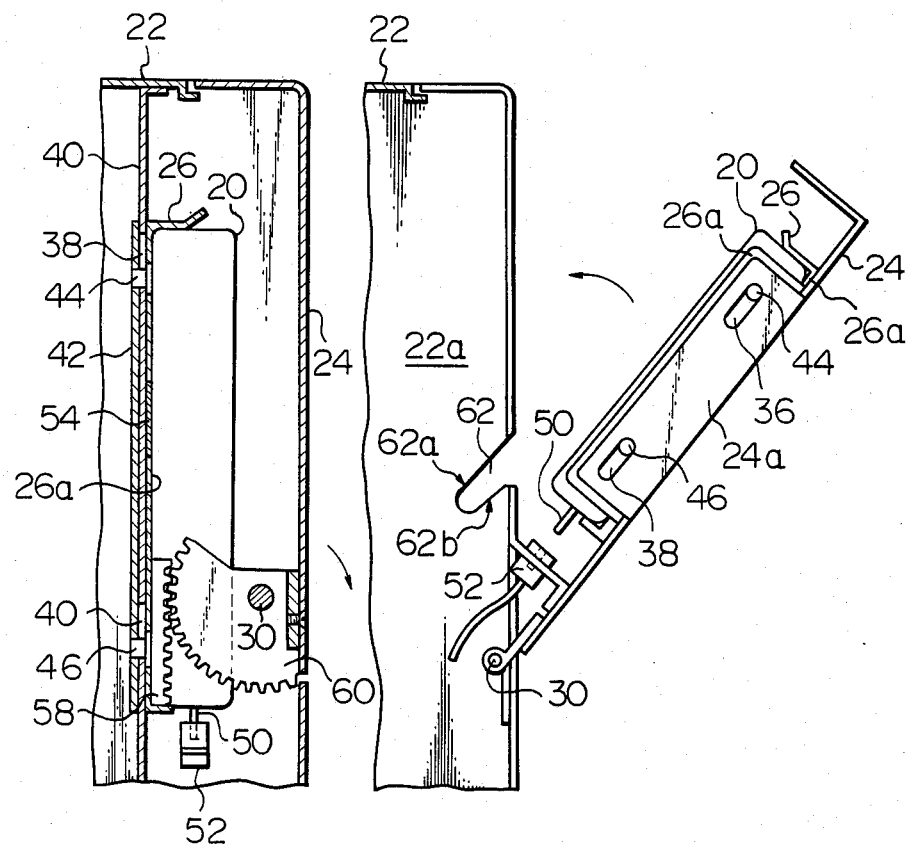

RECEPTACLE FOR MEMORY CASSETTE

BACKGROUND OF THE INVENTION

The present invention relates to a receptacle for accommodating a so-called memory cassette in which a single memory board carrying RAMs, ROMs and/or like semiconductor memories is installed. More particularly, the present invention relates to a memory cassette receptacle applicable to such a device as a pattern generator which reads out data from a memory cassette loaded thereinside.

A prior art receptacle of the type described permits a memory cassette to be manually loaded in or unloaded from the receptacle so long as the capacity of the memories stored in the cassette or the number of terminals of a connector for the memory board is relatively small. Where the memory capacity or the number of terminals is relatively large, a substantial magnitude of force is required for loading and unloading the cassette and this has been implemented by a control lever which is associated with the receptacle and manipulated after loading the cassette in the receptacle to connect the terminals of the cassette to the connector of the receptacle.

SUMMARY OF THE INVENTION

It is an object of the present invention to provide a receptacle which allows a memory cassette to be readily and accurately loaded therein or unloaded therefrom even if the memory capacity or the number of terminals thereof is large.

It is another object of the present invention to provide a receptacle which interlocks electrical connection of a memory cassette to the housing of the receptacle with a movement of a cover mounted to the housing, so that a single manual operation may suffice for the electrical connection.

It is another object of the present invention to provide a receptacle which promotes positive restraint and accurate orientation of a memory cassette in the housing of the receptacle, thereby insuring proper electric connection of the cassette to a connector of the housing.

It is another object of the present invention to provide a generally improved receptacle for a memory cassette.

A receptacle for detachably receiving a memory cassette embodying the present invention includes a housing for accommodating the memory cassette. A cover member is movable between an open position and a closed position relative to the housing for loading and unloading the memory cassette. A holder member reciptocates interlocked with the movement of the cover member to hold the memory cassette. Means is provided for driving the holder member in a reciprocal movement.

The above and other objects, features and advantages of the present invention will become apparent from the following description taken with the accompanying drawings.

BRIEF DESCRIPTION OF THE DRAWINGS

FIG. 2 is a fragmentary sectional side elevation of the receptacle shown in FIG. 1;

FIG. 3 is a fragmentary front view of the receptacle with a cover omitted for clarity;

FIGS. 5 and 6 are fragmentary sections of two different modifications to the embodiment of FIGS. 1–4;

DESCRIPTION OF THE PREFERRED EMBODIMENTS

While the receptacle for a memory cassette of the present invention is susceptible of numerous physical embodiments, depending upon the environment and requirements of use, substantial numbers of the herein shown and described embodiments have been made, tested and used, and all have performed in an eminently satisfactory manner.

Figure 1:
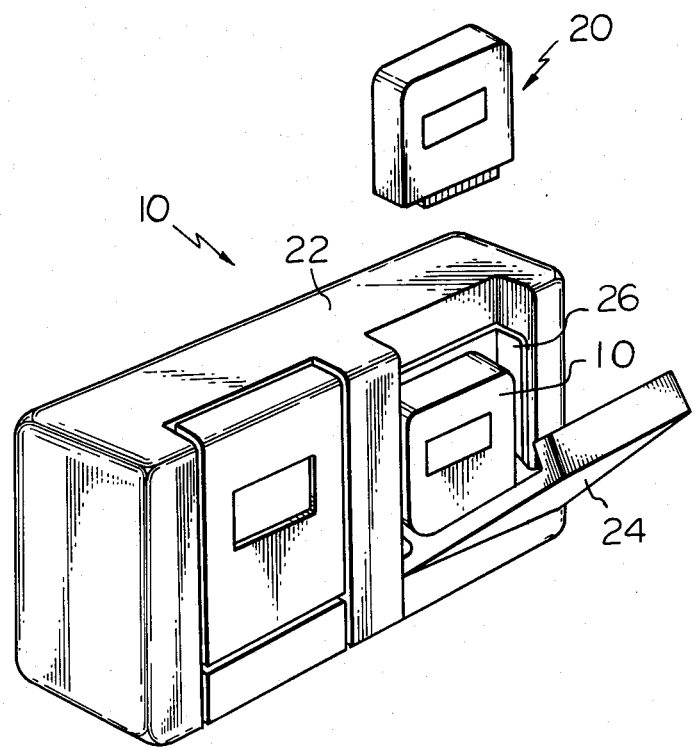
FIG. 1 is a perspective view of a memory cassette and a receptacle therefor in accordance with the present invention.

Referring to FIG. 1 of the drawings, the receptacle is generally designated by the reference numeral 10 and constructed to receive a memory cassette 20 thereinside. The receptacle 10 may have two cassette chambers side by side as illustrated. The receptacle 10 comprises a housing 22 and a cover 24 pivotted to the housing 22 and associated with the cassette chamber. A cassette holder 26 is located inside the cassette chamber to retain the memory cassette 20. As shown in FIGS. 2 and 3, elongate actuator members 28 are rigidly mounted on the back of the cover 24 at laterally opposite sides of the latter, although only one of them is shown in the drawings. Each link member 28 is pivotted by a stub shaft 30 to an adjacent side plate 32 of the associated cassette chamber so that the cover 24 may bodily swing between its open and closed positions relative to the housing 22. Pins 34 are studded in opposite lower end portions of the cassette holder 26 and are respectively engaged in recesses 28a which are formed in hook-shaped lower ends of the actuator members 28.

Figure 4A:
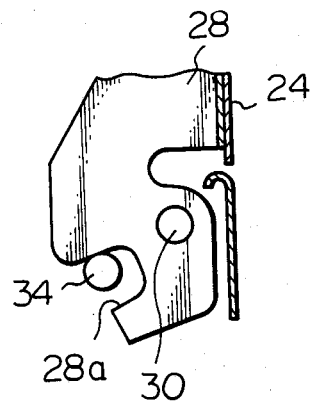
FIGS. 4a–4d are views of the cover and an actuator member in different relative positions.
Figure 4B:
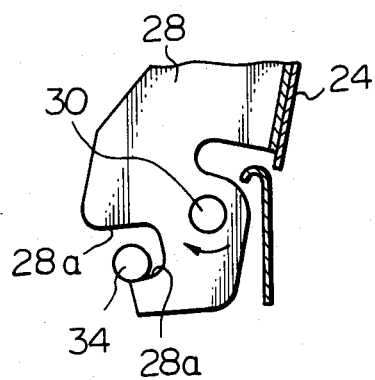
Figure 4C:
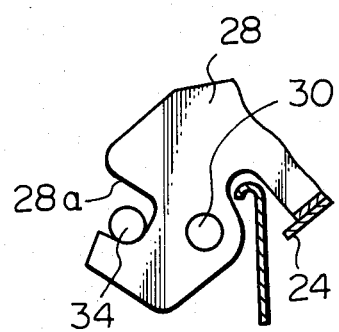
Figure 4D:
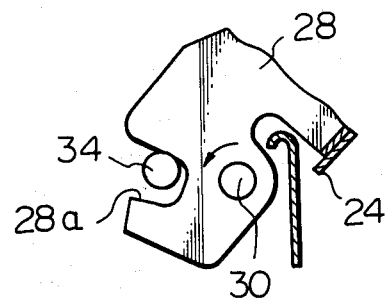

Two vertically elongate slots 36 and 38 are formed at spaced positions through a back or cassette receive plate 40 of the housing 22 which delimits the depth of the cassette chamber. A retainer plate 42 faces a back or hold plate 26a of the cassette holder 26 through the back plate 40 and is rigidly connected thereto by a guide pin 44, which is movably received in the upper slot 38. Another guide pin 46 is movably received in the lower slot 40 and also connects the retainer plate 42 to the cassette holder 26. In this construction, when the cover 24 is opened, the actuators 28 rotate clockwise therewith about the stub shafts 30 as viewed in FIG. 2 to lift the pins 34 which are engaged in the slots 28a. Then, the guide pins 44 and 46 slide upwardly along the associated slots 36 and 38 in the back plate 40, thereby lifting the cassette 20 which is positioned by the holder 26 and a lateral guide plate 48 integral with the holder 26. When the cover 24 is closed, the recesses 28a of the actuators 28 urge the pins 34 and, therefore, the cassette 20 downwardly until terminals 50 at the bottom of the cassette 20 becomes inserted into a connector 52 on the housing 22. This sets up electrical connection of the cassette 20 to the housing 22. The relative position between the actuator 28 and its associated pin 34 sequentially varies as shown in FIGS. 4a–4d during the course of such movements of the cover 24. As the cover 24 is opened from the position shown in FIG. 4a, the lower edge of the recess 28a abuts against and lifts the pin 34 to the position shown in FIG. 4b. The full open position of the cover 24 is shown in FIG. 4c, in which the cassette 20 may be replaced with another. As the cover 24 is moved toward the housing 22 from the full open position, the upper edge of the recess 28a lowers the pin 34 in contact therewith as shown in FIG. 4d back to the full closed position shown in FIG. 4a.

The guide plate 48 carries a magnet 54 substantially at the center of its back surace. The magnet 54 constitutes magnetic coupling means in cooperation with a magnetic metal sheet 56 which is adhered to a portion of an outer surface of the cassette 20 which corresponds to the magnet 54. The magnetic coupling means insures restraint over the cassette 20 within the housing 22 and proper electrical connection between the terminals 50 of the cassette 20 and the connector 52 in the housing 22. When the user misorientes the cassette 20 such that its side where the metal sheet 56 is absent faces the magnet 54, the cassette 20 fails to be retained by the housing 22 due to the lack of effective magnetic attraction therebetween. Such a failure-free operation will also be attained if the magnet is mounted on the cassette and the magnetic metal sheet on the housing or if the coupling means is located on a side of each of the coactive members instead of the back.

Referring to FIG. 5, a modified form of the embodiment described above is illustrated. In FIG. 5, the same reference numerals as those shown in FIGS. 1-4 designate the same structural elements. Again, the back plate 40 of the housing 22 is formed with the slots 36 and 38 in which the guide pins 44 and 46 are received respectively. The guide pins 44 and 46 connect the retainer plate 42 to the cassette holder 26. A characteristic feature of this modification resides in the use of a rack 58 and a pinion 60 for moving the cassette 20 up and down in accordance with the angular movement of the cover 24. The rack 58 extends vertically on and along a side portion of the cassette holder 26, while the pinion 60 meshing with the rack 58 is rigidly mounted on the adjacent stub shaft 30.

In operation, when the cover 24 is moved away from the closed position, the pinion 60 rotates clockwise together with the stub shaft 30 to lift the rack 58. Then, the guide pins 44 and 46 slide upwardly along their associated slots 36 and 38 so that the cassette holder 26 is shifted upwardly until the terminals 50 of the cassette 20 become disengaged from the connector 52. As the cover 24 is moved toward the closed position after being fully opened to replace the cassette 20, the pinion 60 rotates in the other direction to lower the rack 58 until the terminals 50 of the cassette 20 become engaged in the connector 52.

Another modification to the embodiment shown in FIGS. 1-4 is shown in FIG. 6, in which the same reference numerals as those of FIGS. 1-4 designate the same structural elements. As shown, the cassette holder 26 and connector 52 are mounted on the back of the cover 24 and not on the housing 22. The guide pins 44 and 46 are studded on each side wall 26a of the cassette holder 26 and respectively passed through the slots 36 and 38 formed through the adjacent side plate 24a of the cover 24. Each side plate 22a which delimits the lateral dimension of the cassette chamber is formed with an inclined generally U-shaped recess 62 in which the lower guide pin 46 is engageable when the cover 24 is moved toward the closed position about the stub shafts 30.

In the construction shown in FIG. 6, as the cover 24 is moved toward the closed position, the guide pin 46 is brought into the U-shaped recess 62 and urged downwardly along the inclined upper edge 62a of the recess 62. This causes the cassette holder 26 to move downwardly through the guide pin 46 until the terminals 50 become electrically connected to the connector 52. Upon opening the cover 24, the guide pin 46 slides along the lower edge 62b of the inclined recess 62 and is thereby moved upwardly to raise the cassette out of electrical connection with the connector 52.

It will be apparent that the magnetic coupling means, i.e., magnet 54 and metal sheet 56, is effectively applicable to the modifications described as well. If desired, such magnetic coupling means may be combined with or replaced by another kind of positioning means which may be typified by a click stop.

Figure 7:
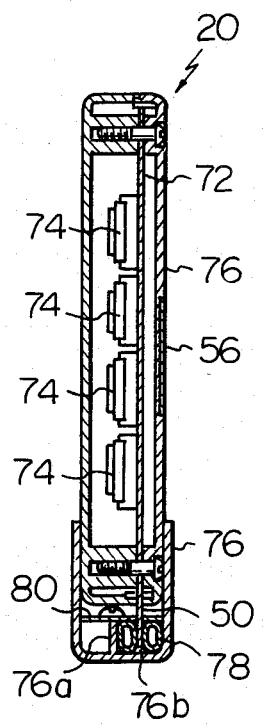
FIG. 7 is a sectional side elevation of a memory cassette and a terminal cover associated therewith.
Figure 8:
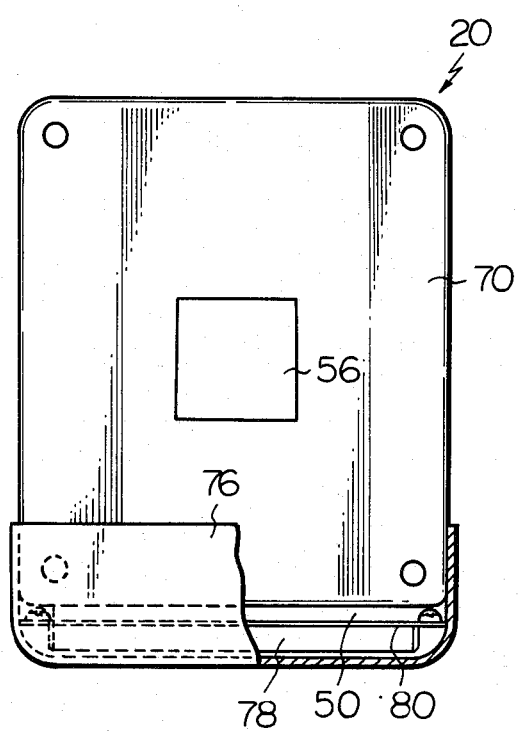
FIG. 8 is a rear end view of the memory cassette and terminal cover shown in FIG. 7.

Now, as shown in FIGS. 7 and 8, the memory cassette 20 comprises a casing 70 in which a memory board 72 carrying semiconductor memory elements 74 thereon is installed. The terminals 50 protrude from the bottom of the memory board 72 to the outside of the casing 70. It is a primary requisite here that the terminals 50 outside the casing 70 be protected from mechanical shocks such as dropping, hitting and smearing. Also, the memory elements 74 themselves have to be protected from static electricity and other electrical shocks. These requirements have heretofore been implemented by putting the memory elements 74 in a conductive cushion or by wrapping up the memory board 72 in a conductive metal foil. The present invention is successful to implement such demands in both the electrical and mechanical aspects by employing a terminal cover, as illustrated in FIGS. 7 and 8.

Referring to FIGS. 7 and 8, the terminal cover designated by the reference numeral 76 comprises a partition wall 76a and a lug 76b. A pair of tubular conductive members 78 each being formed of an elastic material are located within the terminal cover 76 by the partition 76a, lug 76b and a retainer plate 80 fastened to the cover 76 above the tubular conductors 78. The retainer plate 80 is formed with a slot through which the terminal 50 may be inserted into between the conductors 78, which remain in contact with each other while the terminal 50 is absent. The enclosure by the terminal cover 76 isolates the terminals 50 from externally derived mechanical shocks. Also, because the terminals 50 are entirely held between the two resilient conductors 78, they are made electrically conductive and thereby protected from electrical shocks such as unusual voltage, which may be locally applied to the semiconductor memory elements due to static electricity or the like.

Figure 9:
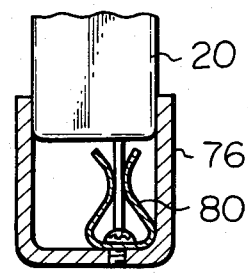
FIGS. 9 and 10 are views of alternative elastic conductors which are positioned in the terminal cover.
Figure 10:
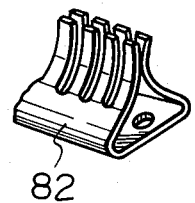

The tubular elastic conductors 78 may be made of conductive rubber which is the rubber containing carbon or like conductive material. The conductive rubber will make the construction simple and economical, prevent the terminals from being scratched or chipped due to the inherent elasticity, and set up stable conduction due to its even contact with the terminals. If desired, the tubular conductors 78 may be replaced by a single thin leaf spring 80 made of metal as shown in FIG. 9, or a metal leaf spring 82 as shown in FIG. 10 which has a number of fingers for engagement with the individual terminals 50.

Various modifications will become possible for those skilled in the art after receiving the teachings of the present disclosure without departing from the scope thereof.

What is claimed is:

1. A receptacle for detachably receiving a memory cassette, comprising:
   a housing for accommodating the memory cassette;
   a cover member movable between an open position for loading and unloading the memory cassette and a closed position relative to said housing;
   a holder member for reciprocation interlocked with the movement of said cover member to hold the memory cassette;
   means for driving the holder member in a reciprocal movement between a first position when the cover member is in the open position and a second position position when the cover member is in the closed position; and
   a connector member for receiving and electrically connecting to terminals projecting from the lower end of the memory cassette only when the cover member is in the closed position.

2. A receptacle as claimed in claim 1, in which the housing comprises side plates, the cover member comprising a front cover plate for covering the front surface of the memory cassette, and actuator members secured to the back of said front cover plate and rotatable about stub shafts, which are secured to the side plates of the housing.

3. A receptacle as claimed in claim 2, in which the holder member comprises side plates and pins studded on said side plates, the actuator member being formed with recesses in which said pins slidingly engage respectively, the holder member drive means comprising said pins and recess.

4. A receptacle as claimed in claim 2, in which the actuator member comprises a pinion rotatable about the stub shaft, the holder member comprising a rack which is meshed with said pinion, the holder member drive means comprising said pinion and rack.

5. A receptacle as claimed in claim 1, in which the cover member comprises side plates which are formed with slots, the holder member comprising guide pins engaged in the slots, so that the holder member is slidable relative to the cover member.

6. A receptacle as claimed in claim 5, in which the housing comprises side plates each being formed with a generally U-shaped recess in which the respective guide pin is engageable, the holder member drive means comprising said guide pins and recesses.

7. A receptacle as claimed in claim 1, in which the holder member comprises a cassette guide plate having side walls which guide laterally opposite portions of the memory cassette.

8. A receptacle as claimed in claim 7, in which the cassette guide plate comprises means for retaining the memory cassette loaded in the housing in a predetermined position.

9. A receptacle as claimed in claim 8, in which the positioning means comprises a first coupling member formed on the cassette and a second coupling member formed in the cassette guide plate which engages with said first coupling member.

10. A receptacle as claimed in claim 9, in which the first coupling member comprises a magnet and the second coupling member comprises a magnetic metal sheet.

11. A receptacle as claimed in claim 9, in which the first coupling member comprises a magnetic metal sheet and the second coupling means comprises a magnet.

12. A receptacle for detachably receiving a memory cassette, comprising:
   a housing for accommodating the memory cassette;
   a cover member movable between an open position for loading and unloading the memory cassette and a closed position relative to said housing;
   a holder member for reciprocation interlocked with the movement of said cover member to hold the memory cassette; and
   means for driving the holder member in a reciprocal movement between a first position when the cover member is in the open position and a second position position when the cover member is in the closed position;
   the housing comprising a cassette receive plate, the holder member comprising a hold plate for reciprocating vertically on and along the front surface of the cassette receive plate, and a retainer plate interlocked with said cassette hold plate to slide vertically at the back of the cassette receive plate;
   the cassette receive plate being formed with at least two slots, the holder member further comprising guide pins which are respectively engaged in said slots to connect the hold plate to the retainer plate integrally.

* * * * *